(12) United States Patent
Ding

(10) Patent No.: US 9,332,680 B2
(45) Date of Patent: May 3, 2016

(54) ELECTRICAL GASKET AND ELECTRONIC MODULE HAVING ELECTRICAL GASKET

(71) Applicant: Autoliv ASP Inc., Ogden, UT (US)

(72) Inventor: Xueru Ding, Newton, MA (US)

(73) Assignee: Autoliv ASP, Inc., Ogden, UT (US)

( * ) Notice: Subject to any disclaimer, the term of this patent is extended or adjusted under 35 U.S.C. 154(b) by 21 days.

(21) Appl. No.: 13/834,533

(22) Filed: Mar. 15, 2013

(65) Prior Publication Data

US 2014/0268583 A1 Sep. 18, 2014

(51) Int. Cl.
*H05K 9/00* (2006.01)

(52) U.S. Cl.
CPC ............... *H05K 9/0016* (2013.01); *H05K 9/00* (2013.01)

(58) Field of Classification Search
CPC .............................. H05K 9/00; H05K 9/0016
USPC ............. 174/50.62, 50.52, 370, 371; 361/728
See application file for complete search history.

(56) References Cited

U.S. PATENT DOCUMENTS

| | | | | |
|---|---|---|---|---|
| 2,825,042 A * | 2/1958 | Tollefson et al. | ........ | 439/607.01 |
| 5,053,924 A * | 10/1991 | Kurgan | ......................... | 361/818 |
| 5,511,798 A * | 4/1996 | Kawamoto et al. | ............ | 277/647 |
| 6,294,729 B1 * | 9/2001 | Kaplo | ........................... | 174/371 |
| 6,320,121 B1 * | 11/2001 | Honeycutt et al. | ............ | 174/384 |
| 6,366,245 B1 | 4/2002 | Schmidt et al. | | |
| 6,624,432 B1 | 9/2003 | Gabower et al. | | |
| 6,654,256 B2 * | 11/2003 | Gough | ................. | H05K 9/0016 174/383 |
| 6,901,660 B2 * | 6/2005 | Miska | ............................. | 29/846 |
| 7,446,265 B2 * | 11/2008 | Krohto et al. | ................. | 174/377 |
| 7,501,587 B2 * | 3/2009 | English | ......................... | 174/354 |
| 2013/0147657 A1 | 6/2013 | Lee et al. | | |
| 2013/0148318 A1 * | 6/2013 | Kim | ............................. | 361/759 |

FOREIGN PATENT DOCUMENTS

| | | |
|---|---|---|
| EP | 0 642 190 B1 | 1/1999 |
| WO | 2013055272 A1 | 4/2013 |

\* cited by examiner

*Primary Examiner* — Hoa C Nguyen
*Assistant Examiner* — Keith Depew
(74) *Attorney, Agent, or Firm* — Burns & Levinson, LLP; Steven M. Mills

(57) ABSTRACT

An electrical gasket provides an electrical seal between first and second components in an electrical module. The electrical gasket includes an attachment portion for fixedly attaching the electrical gasket to one of the first and second components and a plurality of spring members for engaging the other of the first and second components to make mechanical and electrical contact between the first and second components such that the electrical seal is provided between the first and second electrical components. One of the components of the module can be an EMI shield or printed circuit board of the module, and another of the components can be the module housing.

9 Claims, 3 Drawing Sheets

ELECTRICAL GASKET AND ELECTRONIC MODULE HAVING ELECTRICAL GASKET

BACKGROUND

1. Technical Field

This application relates to electronic equipment, and, in particular, to radio-frequency interference (RFI) and/or electromagnetic interference (EMI) shielding in electronic equipment.

2. Discussion of Related Art

Electronic systems or modules can typically include one or more printed circuit boards (PCBs) populated with electronic circuits and devices. The PCB(s) can be contained within a housing which can have one or more covers which mate together to enclose the PCB(s). Similarly, one or more of the PCB(s) can mate with one or more of the covers of the housing. In some electronic systems or modules, it is important that the internal electronic circuitry be shielded from RFI and EMI, both to prevent RFI and/or EMI in the external environment from interfering with the internal electronic circuitry and to prevent the electronic systems or modules from emitting signals into the external environment.

Typically, to prevent RFI and/or EMI, the mating covers of the housing and/or the mating covers and PCB(s) of the system are made of or coated with a conductive material. When the covers are mated together or when the PCB(s) and cover(s) are mated together, an electrical gasket, which can also include a conductive material, can be interposed between them to provide an electrical seal. Also, one or more shield devices can be installed in the assembly in electrical contact with the housing to shield the internal electronic circuitry. As a result, the circuitry can be completely enclosed by conductive material, which can be connected to the electrical ground of the system. This results in a complete shield against RFI and EMI.

Shields are typically fabricated using a conductive material such as metal or a plastic which absorbs and/or reflects electromagnetic radiation. In some applications, the absorptive and conductive plastic shield is preferred over the purely conductive, e.g., metallic, shield. In order to implement electrical contact between the shield and the housing, a soft conductive gasket can be over-molded to the shield. However, in order to over-mold the soft conductive gasket in applications in which the plastic shield is used, a high-temperature plastic material must be used as the shield material instead of a low-temperature plastic, which results in higher cost.

SUMMARY

According to one aspect, an electrical gasket for providing an electrical seal between first and second components in an electrical module is provided. The electrical gasket includes an attachment portion for fixedly attaching the electrical gasket to one of the first and second components. The electrical gasket also includes a plurality of spring members for engaging the other of the first and second components to make mechanical and electrical contact between the first and second components such that the electrical seal is provided between the first and second electrical components.

In some exemplary embodiments, the electrical gasket comprises a plastic material.

In some exemplary embodiments, the electrical gasket comprises a metallic material.

In some exemplary embodiments, the one of the first and second components to which the gasket is fixedly attached is a shield for providing at least a portion of the electrical module with electromagnetic interference (EMI) shielding.

In some exemplary embodiments, the one of the first and second components to which the gasket is fixedly attached is a printed circuit board.

In some exemplary embodiments, the other of the first and second components is at least a portion of a housing of the electrical module.

According to another aspect, an electrical module is provided. The electrical module includes a housing and a component in the housing. The electrical module also includes an electrical gasket fixedly attached to the component in the housing, the electrical gasket comprising a plurality of spring members for engaging the housing to make mechanical and electrical contact between the component and the housing such that an electrical seal is provided between the component and the housing.

In some exemplary embodiments, the electrical gasket comprises a plastic material.

In some exemplary embodiments, the electrical gasket comprises a metallic material.

In some exemplary embodiments, the component to which the gasket is fixedly attached is a shield for providing at least a portion of the electrical module with electromagnetic interference (EMI) shielding.

In some exemplary embodiments, the component to which the gasket is fixedly attached is a printed circuit board.

BRIEF DESCRIPTION OF THE DRAWINGS

The foregoing and other features and advantages will be apparent from the more particular description of preferred embodiments, as illustrated in the accompanying drawings, in which like reference characters refer to the same parts throughout the different views. The drawings are not necessarily to scale, emphasis instead being placed upon illustrating the principles of the inventive concept.

DETAILED DESCRIPTION

It will be noted that, throughout this application, RFI and EMI will be used interchangeably. It will be understood that the present inventive concept and the exemplary embodiments are applicable to shielding for both RFI and EMI.

Figure 1:
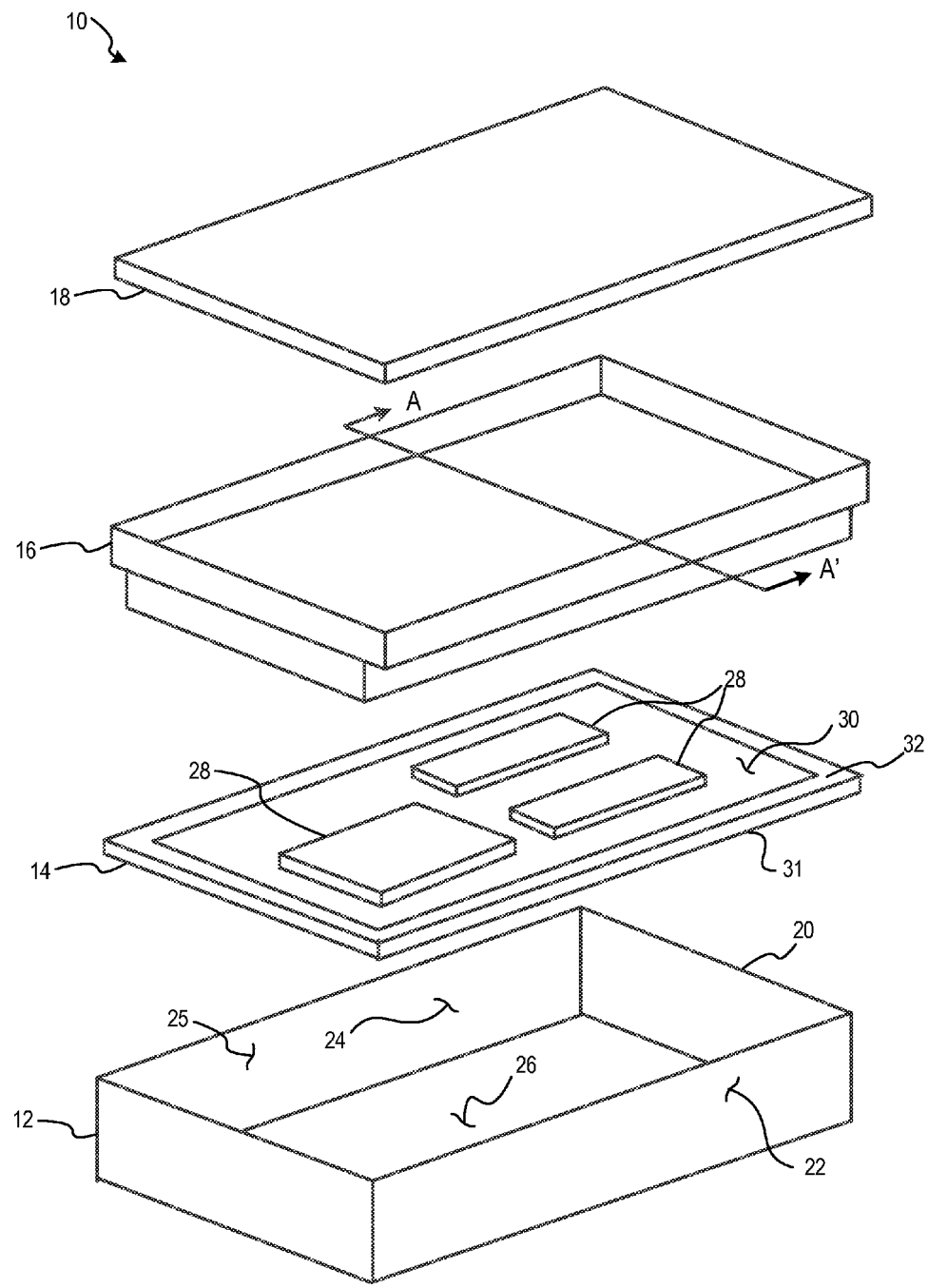
FIG. 1 includes a schematic perspective exploded view of an electronic system or module of the type to which the present inventive concept can be applied.

FIG. 1 includes a schematic perspective exploded view of an electronic system or module 10 of the type to which the present inventive concept can be applied. Referring to FIG. 1, electronic module 10 can include a bottom or base cover 12 having vertical walls 20, which have inner surfaces 24 and outer surfaces 22. Base cover 12 also includes a lower inner surface 26. Base cover 12 can be formed of a conductive material such as a metal, for example, aluminium. Alternatively, base cover 12 can be formed of a nonconductive material 25 such as plastic coated with a conductive material such as conductive paint.

Module 10 can also include one or more printed circuit boards (PCBs) 14, which can be mounted within base cover 12. The PCB(s) 14 can be fixedly attached to base cover 12 on fixed spacers or standoffs or bosses (not shown), such as by screws and threaded holes in standoffs or bosses, an adhesive material, or other fixed attachment means. PCB(s) 14 can include one or more integrated circuits and/or discrete electronic components, collectively referred to herein as PCB devices 28, which are mounted on a top side 30 of PCB 14. It should be noted that PCB devices 28 could also be mounted to a bottom side 31 of PCB 14, or PCB devices 28 could be mounted on both top side 30 and bottom side 31 of PCB 14.

PCBs 14 can include conductive patterns for connecting PCB devices 28 to each other and to the external environment as required. The conductive patterns can be printed on one or more layers or surfaces of PCBs 14. Part of the conductive patterns can include a conductive trace 32, which can be formed on top side 30 and/or bottom side 31 of PCB 14. Conductive trace 32 can be connected to a system ground and, therefore, can serve as a ground plane on PCB 14.

Module 10 can also include a shield 16, which provides shielding for RFI and EMI. Shield 16 is illustrated in FIG. 1 as having a generic rectangular shape, but it will be understood that shield 16 can be made to have any shape desirable for the particular application. Shield 16 can be made of a plastic, EMI-absorptive and/or conductive material. Alternatively, shield 16 can be made of a conductive material such as a metal, e.g., aluminium. In some configurations, shield 16 can be installed in module 10 over PCB(s) 14 to provide EMI shielding for PCB devices 28. In some configurations, shield 16 is located on and makes electrical and mechanical contact with conductive trace 32 on PCB(s) 14.

Module 10 also includes a top cover 18, which is fixedly attached to base cover 22 to complete the housing or enclosure of module 10. Top cover 18 can be attached to base cover 12 by screws and threaded holes (not shown), heat-stake pins, an adhesive, molded clip or clamp mating arrangements in top cover 18 and base cover 12 (not shown) or other known fixed attachment means.

In many applications, such as where module 10 is an automotive radar sensor module, it is desirable to form an electrical seal between components of the system, including, for example, between multiple PCBs 14 and/or between one or more PCBs 14 and one or more covers 12 and 18 of the housing, and/or between one or more shields 16 and one or more covers 12 and 18 of the housing, and/or between one or more shields 16 and one or more PCBs 14. To that end, it is often desirable to form an electrical gasket to facilitate formation of an electrical seal.

Figure 2:
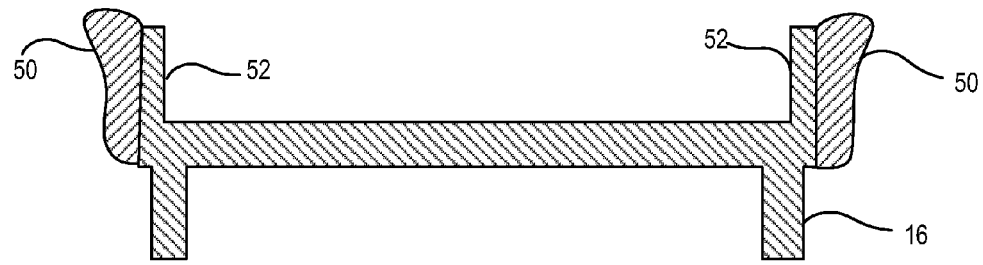
FIG. 2 includes a schematic cross-sectional diagram of a shield as illustrated in FIG. 1, taken along line A-A' of FIG. 1, having a conventional electrical gasket over-molded on the shield of FIG. 1.

FIG. 2 includes a schematic cross-sectional diagram of a shield as illustrated in FIG. 1, taken along line A-A' of FIG. 1, having a conventional electrical gasket over-molded on the shield of FIG. 1. Referring to FIG. 2, to achieve electrical contact between PCB 14 and shield 16 and the housing of module 10, a soft conductive gasket 50 is over-molded to a wall 52 of the metal/conductive or plastic EMI-absorptive/conductive shield 16. When shield 16 is installed in base cover 12, electrical gasket 50 makes electrical and mechanical contact with inner surface 24 of wall 12 to electrically seal shield 16 to base cover 12. However, as mentioned above, in many cases, the plastic absorptive/conductive shield 16 will be preferred over the metallic conductive shield 16. In the case of a plastic shield 16, in order to over-mold the soft and conductive electrical gasket 50 onto shield 16, a high-temperature plastic material must be used for shield 16, which is more expensive than a low-temperature plastic material.

Figure 3:
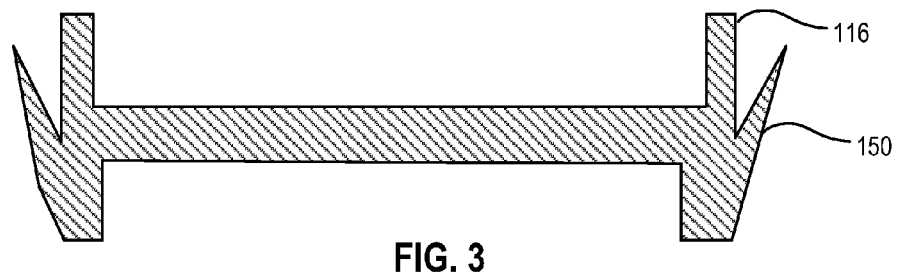
FIG. 3 includes a schematic cross-sectional diagram of a shield as illustrated in FIG. 1, taken along line A-A' of FIG. 1, with an integral electrical gasket, according to some exemplary embodiments.

According to the inventive concept, rather than over-molding a gasket onto shield 16, an electrical gasket is integrally formed with the shield. FIG. 3 includes a schematic cross-sectional diagram of a shield as illustrated in FIG. 1, taken along line A-A' of FIG. 1, with an integral electrical gasket, according to some exemplary embodiments. Referring to FIG. 3, electrical gasket 150 is molded as a part of shield 116, preferably in a single molding process, that is, the same molding process used to form shield 116.

Figure 4:
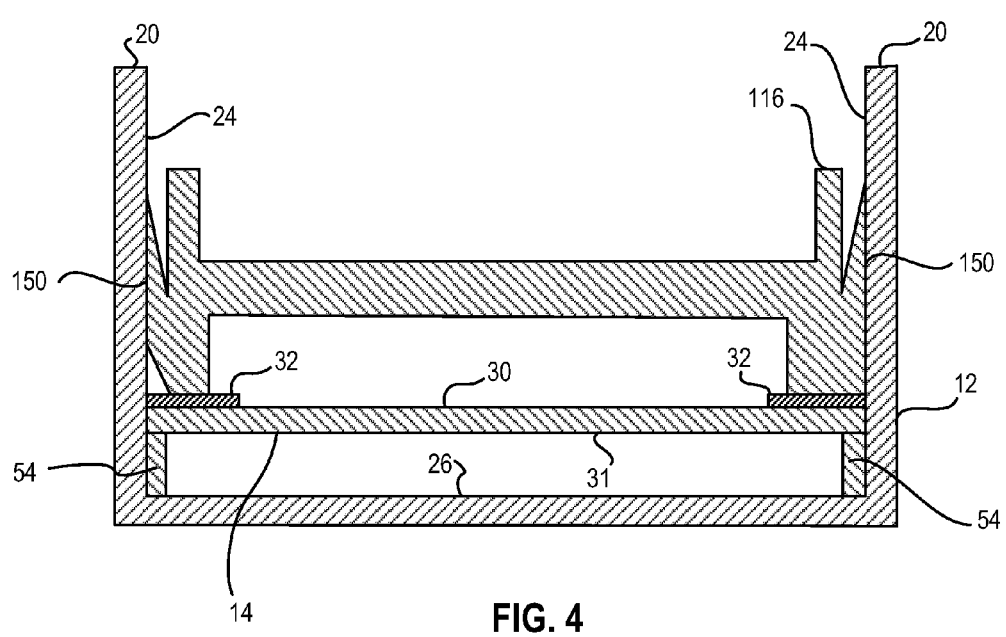
FIG. 4 includes a schematic cross-sectional diagram of the shield of FIG. 3, installed in the base cover illustrated in FIG. 1, along with an exemplary PCB illustrated in FIG. 1, according to some exemplary embodiments.

FIG. 4 includes a schematic cross-sectional diagram of shield 116 of FIG. 3, installed in base cover 12 illustrated in FIG. 1, along with an exemplary PCB 14 illustrated in FIG. 1, according to some exemplary embodiments. Referring to FIGS. 3 and 4, electrical gasket 150 is configured in the form of a plurality of spring fingers, also referred to herein as "comb-pins," which are urged outwardly toward inner surface 24 of wall 20 of base cover 12. As illustrated in FIG. 3, the spring fingers of electrical gasket 150 are in a quiescent, non-compressed state. However, as illustrated in FIG. 4, when shield 116 is installed in base cover 12, the spring fingers are urged against inner surface 24 of wall 20, such that electrical contact is made between shield 116 and wall 20, and shield 116 is held in place in base cover 12 by the spring force of the spring fingers against wall 20. Electrically conductive contact is made to conductive wall 20 or conductive coating, e.g., paint 25, on inner surface 24 of wall 20.

As further illustrated in the exemplary configuration of FIG. 4, shield 116, held in place by the spring fingers of electrical gasket 150, can be located over PCB 14, which can be mounted in stationary fashion in base cover 12 on spacers, standoffs or integral bosses 54, on bottom surface 26 of base cover 12, which support PCB 14 at its bottom side or bottom surface 31. Additionally, conductive trace 32 on top side or top surface 30 of PCB 14 can be in contact with shield 116 as illustrated. Hence, shield 116 with integral electrical gasket 150 can provide EMI shielding for PCB 14.

It will be noted that the assembly configurations depicted in FIGS. 1-4 are exemplary only and are intended to illustrate the concept and certain embodiments of the shield with integral electrical gasket according to the present disclosure. It will be understood that PCBs may be different in configuration and quantity than as illustrated and described. In fact, the shield and integrated electrical gasket of the inventive concept need not be applied to a system having any PCBs. It may be applied to any system having any kind of device in which shielding is desirable. PCBs are used herein merely as illustrative examples of such devices. Also, the particular assembly illustrated herein, i.e., a PCB over a cover, and a shield with integral electrical gasket over the PCB, is used merely as an illustrative example. Shield 116 may be above or below any number of PCBs and/or devices, and above or below any kind of cover or partition or wall or barrier used in an electrical module in which shielding is desired. The particular configuration of the shielding, electrical gasket and/or devices requiring shielding will depend upon the particular application in which the inventive concept is being employed. In fact, the electrical gasket does not necessarily need to be formed on the shield. According to some exemplary embodiments, the electrical gasket of the inventive concept can be formed directly on the device or devices, i.e., integrated circuits, PCBs, waveguides, conductors, etc., for which EMI shielding is being provided.

Figure 5:
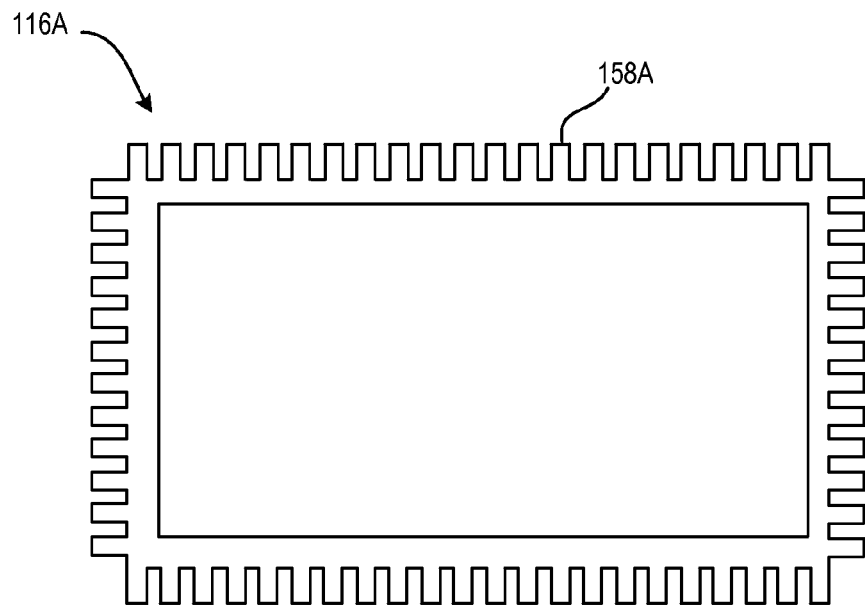
FIGS. 5 and 6 include schematic top views of shields with integral electrical gaskets, according to some exemplary embodiments.
Figure 6:
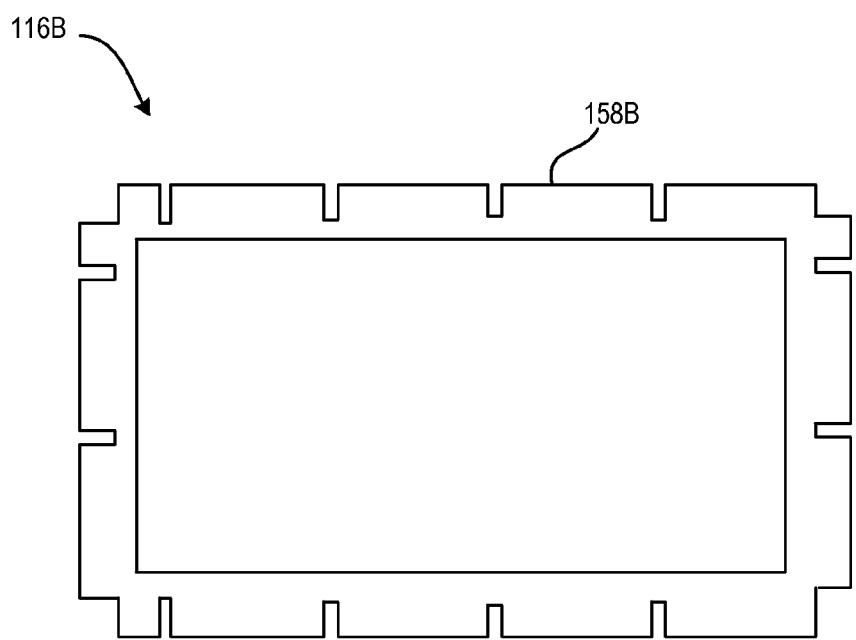

FIGS. 5 and 6 include schematic top view of shields with integral electrical gaskets, according to some exemplary embodiments. Referring to FIG. 5, a shield 116A with narrow spring fingers or narrow comb-pin pattern 158A is illustrated. Referring to FIG. 5, a shield 116B with wide spring fingers or wide comb-pin pattern 158B is illustrated. According to exemplary embodiments, since the electrical contact portion of the electrical gasket is molded along with the component being sealed, e.g., shield 116, almost no extra cost is introduced into producing the shield. With proper design of the thickness of the contact area of the comb-pin, spring-finger structure, the comb-pin structure provides a desired predetermined contact through the pressure of the shield on the housing cover, while being sufficiently strong to prevent breakage, such as while being pressed into the housing cover during assembly. Also, with no over-molding process, no high-temperature plastic is required, also resulting in reduced cost.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

I claim:

1. An electrical module, comprising:
    a first component of the electrical module, the first component comprising a plurality of side walls extending vertically and defining a three-dimensional region enclosed within the vertical side walls, the three-dimensional region having an open top end and a closed bottom end under the open top end;
    a second component of the electrical module, the second component of the electrical module comprising a body portion and a plurality of integral spring members integral with the body portion, the integral spring members being adapted to engage the first component when the first and second components are assembled together to make mechanical and electrical contact between the first and second components such that an electrical seal is provided between the first and second electrical components, wherein
    each of the integral spring members comprises a first end and a second end, the second end of each integral spring member being fixed to the body portion of the second component and being stationary with respect to the body portion of the second component, and the first end of each integral spring member being displaceable horizontally with respect to the body portion of the second component such that horizontal spring forces in the integral spring members exerted on the first ends of the integral spring members maintain engagement between the integral spring members and the vertical side walls of the first component when the first and second components are assembled together, the first ends of the integral spring members being disposed above the second ends of the integral spring members in the three-dimensional region of the first component; and
    a printed circuit board within the three-dimensional region enclosed within the vertical side walls of the first component, the second component being disposed above the PCB and contacting the PCB such that the plurality of integral spring members connect the PCB to the first component.

2. The electrical module of claim 1, wherein the second component comprises a plastic material.

3. The electrical module of claim 1, wherein the second component comprises a metallic material.

4. The electrical module of claim 1, wherein the second component is a shield for providing at least a portion of the electrical module with electromagnetic interference (EMI) shielding.

5. The electrical module of claim 1, wherein the first component is at least a portion of a housing of the electrical module.

6. An electrical module, comprising:
    a housing comprising a plurality of side walls extending vertically and defining a three-dimensional region enclosed within the vertical side walls, the three-dimensional region having a top end and a bottom end under the top end;
    a component in the housing, the component comprising a body portion and a plurality of integral spring members, the integral spring members being adapted to engage the housing to make mechanical and electrical contact between the component and the housing such that an electrical seal is provided between the component and the housing, wherein
    each of the integral spring members comprises a first end and a second end, the second end of each integral spring member being fixed to the body portion of the component and being stationary with respect to the body portion of the component, and the first end of each integral spring member being displaceable horizontally with respect to the body portion of the component such that horizontal spring forces in the integral spring members exerted on the first ends of the integral spring members maintain engagement between the integral spring members and the vertical side walls of the housing, the first ends of the integral spring members being disposed above the second ends of the integral spring members in the three-dimensional region of the housing; and
    a printed circuit board within the three-dimensional region enclosed within the vertical side walls of the housing, the component being disposed above the PCB and contacting the PCB such that the plurality of integral spring members connect the PCB to the housing.

7. The electrical module of claim 6, wherein the component and the integral spring members comprise an absorptive and/or conductive plastic material.

8. The electrical module of claim 6, wherein the component and the integral spring members comprise a metallic material.

9. The electrical module of claim 6, wherein the component is a shield for providing at least a portion of the electrical module with electromagnetic interference (EMI) shielding.

* * * * *